(12) United States Patent
Zhao

(10) Patent No.: US 11,373,559 B2
(45) Date of Patent: Jun. 28, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Kaixiang Zhao, Wuhan (CN)

(*) Notice: Subject to any disclaimer, the term of this patent is extended or adjusted under 35 U.S.C. 154(b) by 203 days.

(21) Appl. No.: 16/652,943

(22) PCT Filed: Dec. 3, 2019

(86) PCT No.: PCT/CN2019/122686
§ 371 (c)(1),
(2) Date: Apr. 1, 2020

(87) PCT Pub. No.: WO2021/008065
PCT Pub. Date: Jan. 21, 2021

(65) Prior Publication Data
US 2022/0005384 A1   Jan. 6, 2022

(30) Foreign Application Priority Data

Jul. 17, 2019   (CN) .......................... 201910645740.3

(51) Int. Cl.
*G09F 9/30* (2006.01)
*H01L 23/538* (2006.01)

(52) U.S. Cl.
CPC .......... *G09F 9/301* (2013.01); *H01L 23/5386* (2013.01)

(58) Field of Classification Search
CPC ... G09F 9/301; G06F 1/1652; H01L 23/5386; H01L 27/124; H01L 27/3276
See application file for complete search history.

(56) References Cited

U.S. PATENT DOCUMENTS

| | | | | |
|---|---|---|---|---|
| 5,247,375 A | * | 9/1993 | Mochizuki | G02F 1/13454 257/59 |
| 7,187,423 B2 | * | 3/2007 | Ozaki | G02F 1/136259 349/54 |
| 2009/0206734 A1 | * | 8/2009 | Kim | H01L 27/3276 313/504 |
| 2016/0181346 A1 | * | 6/2016 | Kwon | H01L 27/3262 257/40 |
| 2016/0293884 A1 | * | 10/2016 | Zhang | H01L 27/3244 |
| 2016/0315284 A1 | * | 10/2016 | Jeon | H01L 51/5256 |
| 2018/0074358 A1 | * | 3/2018 | Jeon | G02F 1/13338 |
| 2018/0158741 A1 | * | 6/2018 | Kim | G09G 3/006 |
| 2019/0057632 A1 | * | 2/2019 | Kim | G09G 3/3225 |

FOREIGN PATENT DOCUMENTS

CN    109872634 A  *  6/2019  ............. G09G 3/006

* cited by examiner

*Primary Examiner* — Joe H Cheng

(57) ABSTRACT

The present disclosure provides a display panel and a display device. The display panel includes a functional region and a peripheral region surrounding the functional region, wherein the functional region is provided with peripheral working wiring adjacent to the peripheral region, and the peripheral region is provided with anti-crack wiring including a plurality of wiring sub-units that are disconnected from each other. The display device includes the above display panel.

9 Claims, 4 Drawing Sheets

DISPLAY PANEL AND DISPLAY DEVICE

CROSS-REFERENCE TO RELATED APPLICATIONS

This application is a U.S. National Stage of PCT/CN2019/122686 filed on Dec. 3, 2019, which claims priority under 35 U.S.C. § 119 of Chinese Application No. 201910645740.3 filed on Jul. 17, 2019, the disclosure of which is incorporated by reference.

FIELD OF THE INVENTION

The present disclosure relates to the technical field of displays, and specifically to a display panel and a display device.

BACKGROUND OF THE INVENTION

When a flexible display panel is designed, in order to prevent external stress from entering a functional region and destroying functional wiring structures, anti-crack wiring is usually added to the outermost peripheral region of an internal circuit. Especially, under a glass cutting process in a current production process, external forces will be generated around a panel when the display panel is cut. When the external forces enter the panel, the anti-crack wiring is first subjected to stress. If the stress from external is excessive, the anti-crack wiring will be broken to obstruct the external forces from entering the panel, in order to prevent internal functional wiring from being broken by the external forces.

In order to avoid a risk of breakage caused by the above external forces, a structure of the anti-crack wiring is disposed around the panel, in which it plays a role in obstructing crack growth. However, it also brings new problems.

As shown in FIG. 1, which is a schematic structural diagram illustrating anti-crack wiring of a panel in the prior art. Since anti-crack wiring 91 is a large piece of metal material interconnecting in a fence manner and surrounding the panel, which has low impedance and is close to a cutting path 92, thereby easy to attract electric charges. Thus, when a product is subjected to an electrostatic test, the anti-crack wiring 91 is more likely to be damaged by blasting and transfers the electric charges to working wiring 93 inside the panel, causing that the panel fails to work normally.

Therefore, it is necessary to provide a new display panel and a new display device to overcome problems that exist in the prior art.

SUMMARY OF THE INVENTION

An object of the present disclosure is to provide a display panel and a display device, in which anti-crack wiring can ensure to obstruct external forces from entering the panel. In addition, it can prevent working wiring inside the panel from being damaged by blasting during an electrostatic test, which is caused by excessive accumulation of electric charges on the anti-crack wiring, thereby protecting completeness of wiring located on edges of the display panel and avoiding an abnormal panel caused by a breakage of wiring.

In order to solve the above problem, the present disclosure provides a display panel, which includes a functional region and a peripheral region surrounding the functional region; wherein the functional region is provided with peripheral working wiring adjacent to the peripheral region; and wherein the peripheral region is provided with anti-crack wiring including a plurality of wiring sub-units that are disconnected from each other.

Further, each of the wiring sub-units is shaped as F-shape or comb-shape.

Further, the wiring sub-units are arranged at intervals in a same distance.

Further, a material of each of the wiring sub-units is metal.

Further, each of the wiring sub-units includes at least two crack barrier lines and a common connection line, wherein the common connection line is disposed at one end of each of the crack barrier lines and is configured to connect the crack barrier lines.

Further, one side of the common connection line adjacent to the functional region is flush with an edge of one of the crack barrier lines, and another side of the common connection line away from the functional region extends with a protruding section.

Further, each of the crack barrier lines extends along a direction that extends the peripheral working wiring within the functional region.

Further, the peripheral working wiring includes a peripheral signal wire or a ring-shaped detection wire.

The present disclosure further provides a display device, which includes the display panel described as the above.

Beneficial effects of the present disclosure are that, a display panel and a display device are provided by providing with anti-crack wiring. It can ensure to obstruct external forces from entering the panel, and prevent working wiring inside the panel from being damaged by blasting during an electrostatic test, which is caused by excessive accumulation of electric charges on the anti-crack wiring, thereby protecting completeness of wiring located on edges of the display panel and avoiding an abnormal panel caused by a breakage of wiring.

Figure 1:
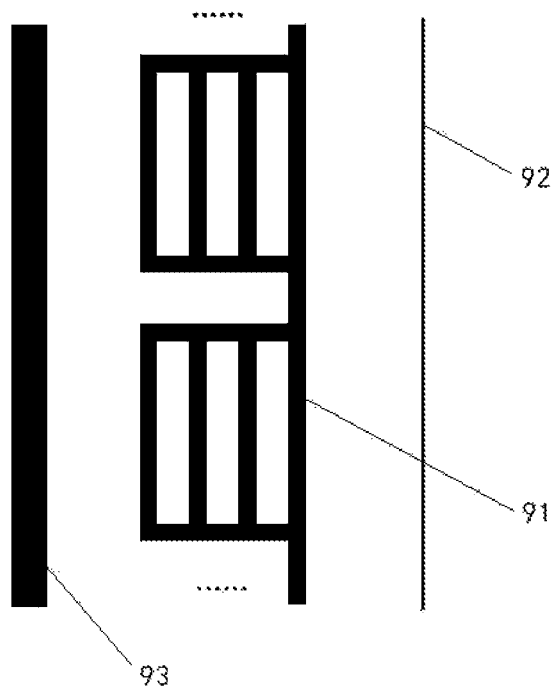
FIG. 1 is a schematic structural diagram illustrating anti-crack wiring of a panel in the prior art.

Parts in the drawings are identified as follows.

100: display device, 10: functional region, 20: peripheral region, 30: peripheral working wiring, 40: anti-crack wiring, 41: wiring sub-unit, 1: peripheral signal wire, 2: ring-shaped detection wire, 3: crack barrier line, and 4: common connection line.

DESCRIPTION OF THE PREFERRED EMBODIMENTS

In the present disclosure, unless specifically stated and defined otherwise, a first feature "above" or "below" a second feature may include the first and second features in direct contact, and may also include the first and second features in contact not directly, but through other features contacted between them. In addition, the first feature "above", "over", and "upon" the second feature includes that, the first feature is directly above and obliquely above the second feature, or only indicates that the first feature is higher in a horizontal level than the second feature. Alternatively, the first feature "below", "under", and "underneath" the second feature includes that, the first feature is directly below and obliquely below the second feature, or only indicates that the first feature is lower in the horizontal level than the second feature.

In the present disclosure, identical or corresponding parts are denoted by a same reference numeral regardless of drawing numbers. Throughout the specification, when wording "first", "second", and the like can be used to describe various parts, these parts does not be limited to the above wording. The above wording is only used to distinguish one part from another part.

This embodiment will be described from a perspective of a display panel. The display panel may be integrated into a display device. The display device may include any product or part having a display function, such as a mobile phone, a television, a monitor, a notebook computer, a digital photo frame, and a navigator.

Embodiment 1

Figure 2:
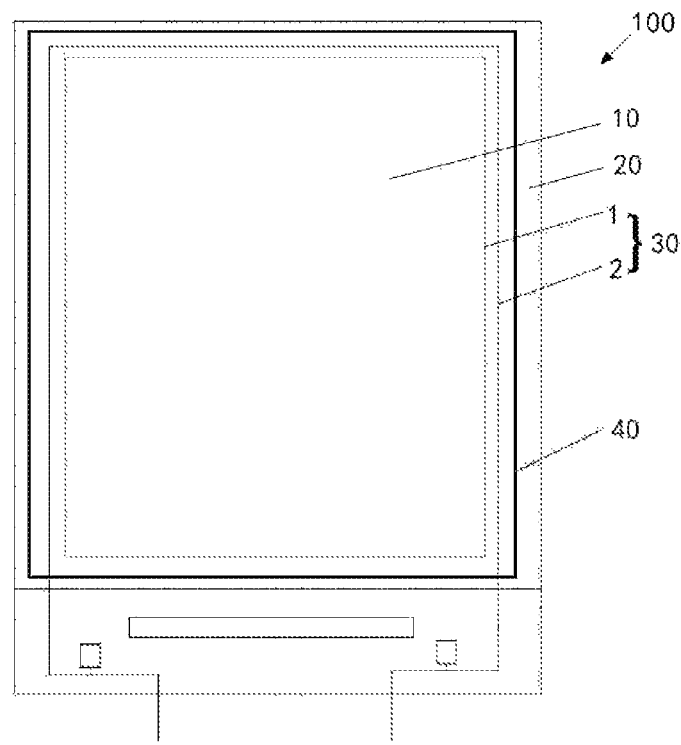
FIG. 2 is a schematic diagram illustrating overall structure of a display panel in a first embodiment of the present disclosure.
Figure 3:
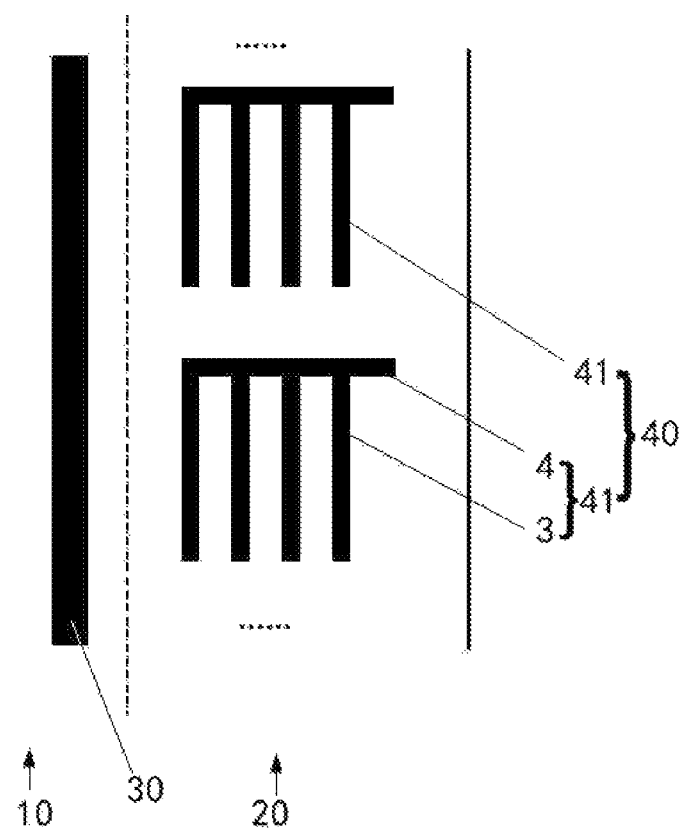
FIG. 3 is an enlarged view illustrating a partial structure of the display panel in the first embodiment of the present disclosure.

Please refer to FIGS. 2 and 3, which illustrate a display panel 100 provided by a first embodiment of the present disclosure. The display panel 100 includes a functional region 10 and a peripheral region 20 surrounding the functional region 10. The functional region 10 is provided with peripheral working wiring 30. The peripheral working wiring 30 is adjacent to the peripheral region 20. The peripheral region 20 is provided with anti-crack wiring 40. The anti-crack wiring 40 includes a plurality of wiring sub-units 41 that are disconnected from each other. The disconnected wiring sub-units 41 are independent of each other, thereby decreasing an area of metal and increasing impedance. Thus, it is difficult for electric charges to accumulate on the anti-crack wiring 40, in which electrostatic protection capability of the anti-crack wiring 40 is improved during an electrostatic test.

Please refer to FIG. 2, in this embodiment, the peripheral working wiring 30 includes a peripheral signal wire 1 and a ring-shaped detection wire 2. The peripheral working wiring 30 is configured as functional wiring inside the display panel 100. The peripheral signal wire 1 is signal or data transmission wiring. The ring-shaped detection wire 2 is detection wiring configured to detect whether a panel circuit is good.

In this embodiment, the anti-crack wiring 40 is added to the outermost peripheral region of the display panel 100. It can ensure that, in a case of a glass cutting process in a current production process, when the display panel 100 is cut and external forces generated around the display panel 100 enter the display panel 100, the anti-crack wiring 40 is first subjected to stress. If the stress from external is excessive, the anti-crack wiring 40 will be broken to obstruct the external forces from entering the display panel 100, thereby preventing the peripheral working wiring 30 from being broken by the external forces.

Please refer to FIG. 3, in this embodiment, each of the wiring sub-units 41 is shaped as F-shape or comb-shape. In such a configuration, the electric charges can be dispersed in each of the wiring sub-units 41, so that a large amount of charge accumulation does not occur, and the wiring sub-units 41 are independent of each other. The wiring sub-units 41 occupy a small area and improve the impedance. The electric charges are not easy to accumulate on the anti-crack wiring 40 resulting in the injury during the electrostatic test, thereby improving electrostatic protection capability of the anti-crack wiring 40 during the electrostatic test.

In this embodiment, the wiring sub-units 41 are arranged at intervals in a same distance. In such an arrangement, the electric charges can be divided evenly, which helps to reduce the overall electrostatic protection capability of the anti-crack wiring 40.

In this embodiment, a material of each of the wiring sub-units 41 is metal. The metal material is adopted for a convenient manufacturing process. It can avoid time loss caused by multiple replacements of materials in a producing process.

Each of the wiring sub-units 41 includes at least two crack barrier lines 3 and a common connection line 4. In this embodiment, each of the wiring sub-units 41 includes a plurality of crack barrier lines 3, which are arranged at intervals in a same distance. The common connection line 4 is disposed at one end of each of the crack barrier lines 3 and is configured to connect the crack barrier lines 3. Namely, one end of each of the crack barrier lines 3 is connected to the common connection line 4, and the other end of each of the crack barrier lines 3 is disconnected. One side of the common connection line 4 adjacent to the functional region 10 is flush with an edge of one of the crack barrier lines 3, another side of the common connection line 4 away from the functional region 10 extends beyond an edge of one of the crack barrier lines 3. In more detail, as shown in FIG. 3, the left end of the common connection line 4 is flush with an edge of the leftmost one of the crack barrier lines 3, and the right end of the common connection line 4 is beyond an edge of the rightmost one of the crack barrier lines 3.

In this embodiment, the wiring sub-units 41 are arranged in an array manner along a same direction. Each of the crack barrier lines 3 extends along a direction that extends the peripheral working wiring 30 within the functional region 10. Please refer to FIG. 3, when the crack barrier lines 3 are straight-line segments, the crack barrier lines 3 are arranged in parallel with the peripheral working wiring 30 within the functional region 10.

When a side of the display panel 100 receives an external force perpendicular to the side, a surface of one of the crack barrier lines 3 of one of the wiring sub-units 41 facing the external force forms a contact surface that is in contact with the external force. If the crack barrier lines 3 are straight-line segments as shown in FIG. 3, since the one of the crack barrier lines 3 is perpendicular to the external force, its stress is the largest.

It is easy to know from the mechanical knowledge that, if each of the crack barrier lines 3 has a sawtooth-shaped structure, a contact surface of one of the crack barrier lines 3 facing the external force is a surface that is not perpendicular to the external force. Namely, a direction of the external force is not perpendicular to the contact surface. Then, when the external force is applied to one of the crack barrier lines 3, the external force is decomposed into a vertical force component perpendicular to the contact surface of one of the crack barrier lines 3 and a parallel force component parallel to the contact surface. In addition, it is easy to know from the mechanical knowledge that, both of the force components are smaller than the external force, the sawtooth-shaped structure of each of the crack barrier lines 3 decomposes the external force into the force components that are smaller than the external force and are directed in other directions. It can alleviate a case that a crack generated by a process of cutting, picking, or transferring a display substrate. If the external force is excessive, that is, the force components formed by decomposing the applied external force can still reach a critical stress, at which the display panel cracks. For each of the crack barrier lines 3 has the sawtooth-shaped structure, within a plane of the display panel 100, along an extending direction of each of the crack barrier lines 3, i.e. along a direction perpendicular to an arrangement direction of the crack barrier lines 3, an actual length of each of the crack barrier lines 3 with the sawtooth-shaped structure is longer within a same straight distance. Such that, the crack will consume energy during a process of propagation. The crack barrier lines 3 can effectively prevent the crack from expanding, so that the straight distance of the crack development in the plane of the display panel 100 is very short. Accordingly, structures of a second embodiment and a third embodiment are proposed as follows.

Embodiment 2

Figure 4:
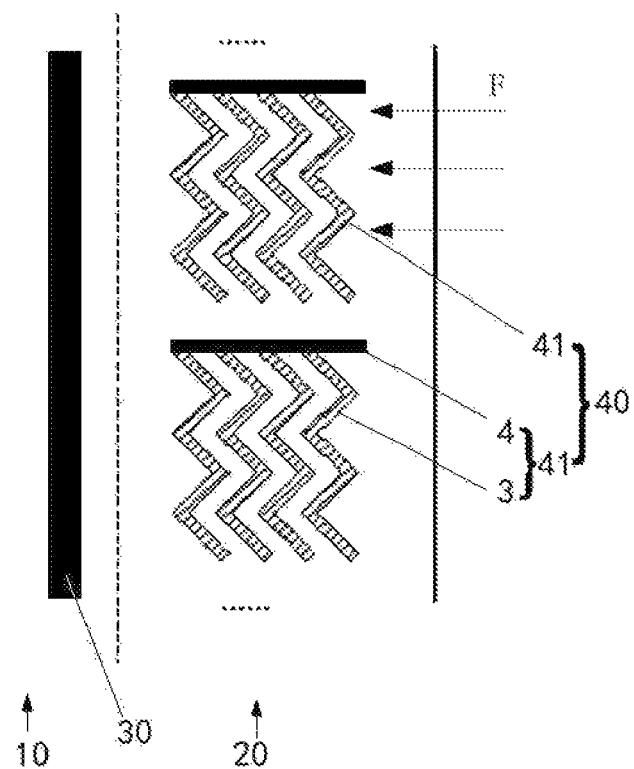
FIG. 4 is an enlarged view illustrating a partial structure of the display panel in a second embodiment of the present disclosure.

Please refer to FIG. 4, in a second embodiment of the present disclosure, each of the crack barrier lines 3 has a sawtooth-shaped structure, such a structure can be configured to prevent first crack propagation. Compared with the first embodiment, a difference is that only each of the crack barrier lines 3 is changed from a linear type to a sawtooth type.

Figure 5:
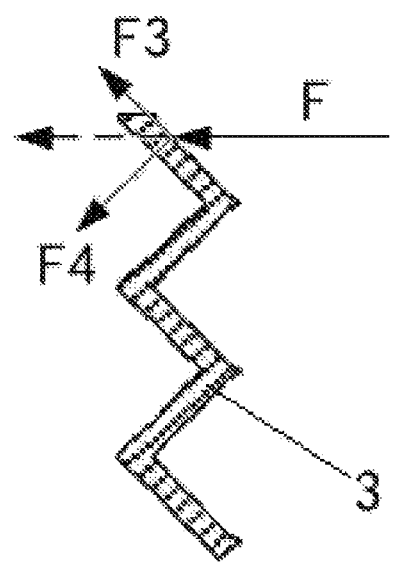
FIG. 5 is a schematic diagram illustrating stress analysis of crack barrier lines shown in FIG. 4.

Please refer to FIG. 5, which is a schematic diagram of stress analysis of the crack barrier lines 3 having the sawtooth-shaped structure. Since an outer side of each of the crack barrier lines 3 presents an oblique surface, which is not perpendicular to an external force F applied to the side, so that the external force F can be decomposed. For example, the external force F can be decomposed into two force components F3 and F4, which are directed in other directions and smaller than the external force. It can effectively alleviate an occurrence of crack during the cutting, picking, or transferring of the display panel 100. In addition, each of the crack barrier lines 3 integrally forms a broken-line-shaped structure, so that the actual length of each of the crack barrier lines 3 is longer, which can effectively prevent the crack from expanding, make the straight distance of crack development in the plane of the display panel 100 be shorter, and avoid affecting display effect. In order to make a barrier effect of each of the crack barrier lines 3 better, an angle formed by two adjacent oblique sides of each of the crack barrier lines 3 can be selected based on an actual setup in a range between 90 degrees (°) and 120 degrees.

Embodiment 3

Figure 6:
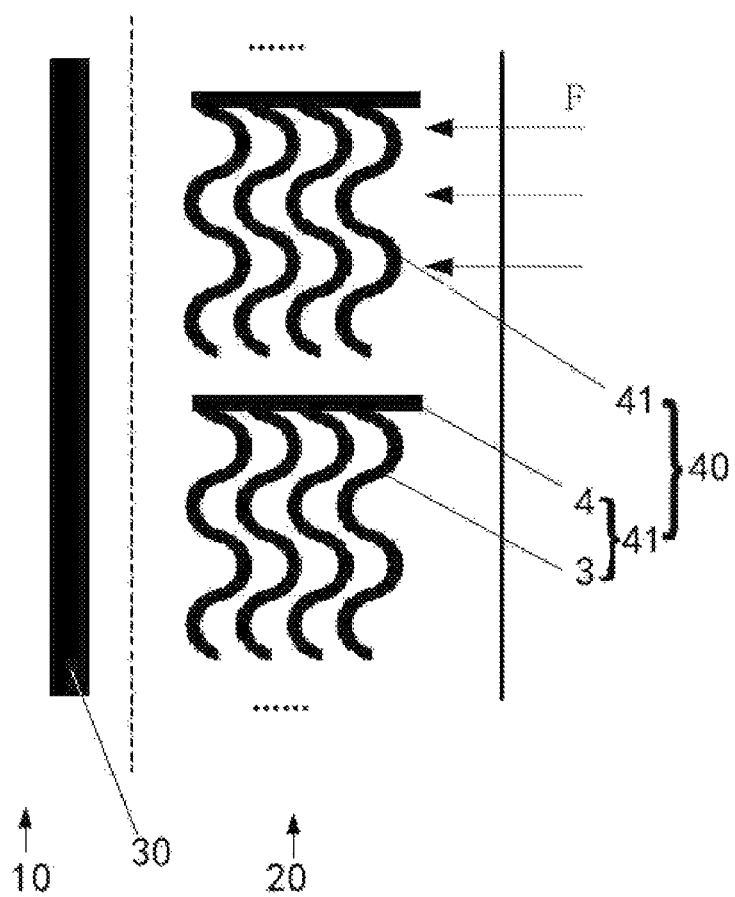
FIG. 6 is an enlarged view illustrating a partial structure of the display panel in a third embodiment of the present disclosure.

Please refer to FIG. 6, in a third embodiment of the present disclosure, each of the crack barrier lines 3 has a sinuous structure, such a structure can be configured to prevent crack propagation. Compared with the first embodiment, a difference is that only each of the crack barrier lines 3 is changed from the linear type to a sinuous type.

Figure 7:
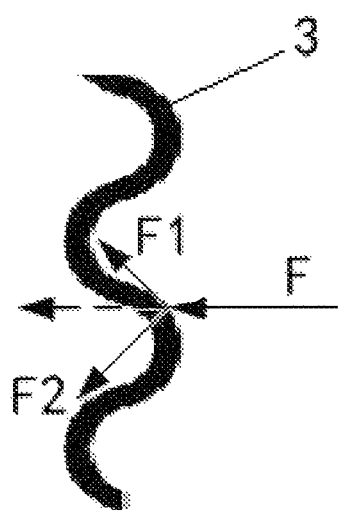
FIG. 7 is a schematic diagram illustrating stress analysis of crack barrier lines shown in FIG. 6.

Please refer to FIG. 7, which is a schematic diagram of stress analysis of the crack barrier lines 3 having the sinuous structure. Since the outer side of each of the crack barrier lines 3 presents a curved surface, which is not perpendicular to the external force F applied to the side, so that the external force F can be decomposed. For example, the external force F can be decomposed into two force components F1 and F2, which are directed in other directions and smaller than the external force. In addition, each of the crack barrier lines 3 is curved, so that the actual length of each of the crack barrier lines 3 is longer, which can effectively prevent the crack from expanding, make the straight distance of crack development in the plane of the display panel 100 be shorter, and avoid affecting display effect.

The present disclosure further provides a display device, which includes the display panel 100 described as the above.

A working principle of the display device provided in this embodiment is consistent with that of the foregoing embodiments of the display panel 100. Specific structural relationship and working principle can be referred to the foregoing embodiments of the display panel 100, and details are not described here again.

Beneficial effects of the present disclosure are that, a display panel and a display device are provided by providing with anti-crack wiring. It can ensure to obstruct external forces from entering the panel, and prevent working wiring inside the panel from being damaged by blasting during an electrostatic test, which is caused by excessive accumulation of electric charges on the anti-crack wiring, thereby protecting completeness of wiring located on edges of the display panel and avoiding an abnormal panel caused by a breakage of wiring.

The above description is only preferred embodiments of the present disclosure. It should be noted that, for those of ordinary skill in the art, without departing from the principle of the present disclosure, several improvements and embellishments can be made and should be seen to a protection scope of the present disclosure.

What is claimed is:

1. A display panel, comprising a functional region and a peripheral region surrounding the functional region;
   wherein the functional region is provided with peripheral working wiring adjacent to the peripheral region; and
   wherein the peripheral region is provided with anti-crack wiring including a plurality of wiring sub-units that are disconnected from each other, and each of the wiring sub-units is shaped as F-shape or comb-shape.

2. The display panel as claimed in claim 1, wherein the wiring sub-units are arranged at intervals in a same distance.

3. The display panel as claimed in claim 1, wherein a material of each of the wiring sub-units is metal.

4. The display panel as claimed in claim 1, wherein each of the wiring sub-units comprises:
   at least two crack barrier lines; and
   a common connection line disposed at one end of each of the crack barrier lines and configured to connect the crack barrier lines.

5. The display panel as claimed in claim 4, wherein one side of the common connection line adjacent to the functional region is flush with an edge of one of the crack barrier lines, and another side of the common connection line away from the functional region extends with a protruding section.

6. The display panel as claimed in claim 4, wherein each of the crack barrier lines extends along a direction that extends the peripheral working wiring within the functional region.

7. The display panel as claimed in claim 1, wherein the peripheral working wiring comprises a peripheral signal wire.

8. The display panel as claimed in claim 1, wherein the peripheral working wiring comprises a ring-shaped detection wire.

9. A display device, comprising the display panel as claimed in claim 1.

\* \* \* \* \*